United States Patent
Lane et al.

(10) Patent No.: US 6,943,625 B2
(45) Date of Patent: Sep. 13, 2005

(54) GAIN AND PHASE BALANCED AMPLIFIER REDUNDANCY SYSTEM

(75) Inventors: Steven O. Lane, Rolling Hills Estates, CA (US); Brian T. Sleight, Redondo Beach, CA (US)

(73) Assignee: The Boeing Company, Chicago, IL (US)

( * ) Notice: Subject to any disclaimer, the term of this patent is extended or adjusted under 35 U.S.C. 154(b) by 38 days.

(21) Appl. No.: 10/707,151

(22) Filed: Nov. 24, 2003

(65) Prior Publication Data

US 2005/0110564 A1 May 26, 2005

(51) Int. Cl.[7] .............................................. H03F 3/68
(52) U.S. Cl. ................................. 330/124 D; 330/51
(58) Field of Search ......................... 330/124 D, 51, 330/124 R, 295

(56) References Cited

U.S. PATENT DOCUMENTS 3,600,682 A * 8/1971 Yoshimoto et al. ......... 370/225
5,828,268 A * 10/1998 Ando et al. ............. 330/124 D
5,986,500 A * 11/1999 Park et al. ............... 330/124 D
6,069,529 A * 5/2000 Evans .................... 330/124 D

* cited by examiner

*Primary Examiner*—Henry Choe
(74) *Attorney, Agent, or Firm*—Justin H. Purcell; Artz & Artz, PC

(57) ABSTRACT

An amplifier redundancy system includes an amplifier receiving signals from a first input switch when the switch is in a side port position. The system further includes a first output switch, in a side port position, receiving signals from the amplifier. A second amplifier receives signals from the first input switch through a second input switch and generates amplified signals therefrom. The second input switch also receives signals from the first input switch when the first input switch is in the side port position. The first input switch is initially in the side port position but switches to a through port position in response to a failure in the second amplifier. A second output switch is in a through port position and switches to a side port position and receives signals through the first output switch in response to the failure in the second amplifier.

11 Claims, 5 Drawing Sheets

GAIN AND PHASE BALANCED AMPLIFIER REDUNDANCY SYSTEM

BACKGROUND OF INVENTION

The present invention relates generally to amplifier redundancy systems, and more particularly, to a gain and phase balanced amplifier redundancy system suitable for use in satellite communications payloads.

A typical satellite communications payload includes an output section that may contain multiple amplifiers. These amplifiers are sometimes configured such that satellite communications signals, intended for a user on the ground, pass through more than one amplifier to generate a large amount of output power (more than is capable of being delivered by a single amplifier). This type of system is sometimes referred to as a matrix amplifier system.

For matrix amplifier systems, the phase and amplitude of the signals passing through each amplifier path are significant because these signals combine with a specific phase to achieve a power distribution among satellite antenna radiating elements, which is required to obtain a proper antenna pattern.

Redundancy ringsnetworks having redundancy switches are often included in such amplifier arrangements to prevent the failure of a single amplifier from degrading an entire payload performance.

Typically, redundancy switches are used to switch out the failed amplifier and switch in an additional redundant amplifier held in reserve. For example, if four amplifiers are normally required, five amplifiers may be placed in the payload (one redundant amplifier). This is called a five-for-four redundancy. Other systems might be used depending on the reliability of the amplifiers, for example, six-for-four redundancy, three-for-two, etc.

A typical amplifier redundancy system, such as the five-for-four system, includes a plurality of inputs and a plurality of amplifiers associated thereto. For example, a first signal at a first input is amplified by the first amplifier, a second input is amplified by a second amplifier, etc. Important to note is that the line length from the input to an output passing through one of the amplifiers may be different than the line length from an input to the output passing through an extra amplifier due to the physical size of the amplifier, difference in line length through the switch, etc.

The aforementioned difference in line length causes the phase of each signal paths to be different for both no failure and redundant cases. In current designs, particularly designs in which matrix amplifier systems are used to provide flexibility and power allocation to different antenna beams, the phase change causes some power to exit undesired matrix ports, changing the antenna pattern and degrading payload performance.

Alternate systems include redundant amplifiers placed centrally to reduce the number of switches that must be reconfigured to switch in the redundant amplifier. Usually, the input side and output side switches are associated in pairs so that one command reconfigures both switches, thereby reducing the number of commands that must be sent. However, this system still introduces differences in line length when the redundant amplifier is activated.

The additional line lengths characteristic to the aforementioned systems cause increased signal loss and introduce at least both a small amplitude error and a phase error.

The disadvantages associated with current amplifier redundancy systems have made it apparent that a new system is needed. The new system should substantially minimize line lengths and should also decrease amplitude and phase errors of signals traveling through a matrix amplified system. The present invention is directed to these ends.

SUMMARY OF INVENTION

In accordance with one aspect of the present invention, an amplifier redundancy system includes a first output switch including a side port position and a through port position, wherein the first output switch is in the side port position, and wherein the first output switch receives signals from a first amplifier.

The system further includes a first input switch including a side port position and a through port position, wherein the first input switch is in the side port position, and wherein the first input switch switches to the through port position in response to a failure in a second amplifier.

The system still further includes a second input switch including a side port position and a through port position, wherein the second input switch receives signals from the first input switch when the first input switch is in the side port position.

Also included in the system is a second output switch including a side port position and a through port position, wherein the second output switch is in the through port position, and wherein the second output switch switches to the side port position and receives signals through the first output switch in response to the failure in the second amplifier.

The system further includes the first amplifier receiving signals from the first input switch when the first input switch is in a side port position. The second amplifier receives signals from the first input switch through the second input switch and generates amplified signals therefrom.

In accordance with another aspect of the present invention, a method for operating an amplifier redundancy system includes activating an input switch and switching the input switch from a first position to a second position such that signals are directed from a failed amplifier to a first redundant amplifier. An output switch is then activated and switched from a first position corresponding to the input switch second position to a second position corresponding to the input switch first position such that signals are received from the first redundant amplifier.

One advantage of the present invention is that it equalizes line length differences for signals traveling through the amplifier redundancy system. This equalization in differential length reduces signal degradation including amplitude errors and phase errors.

It is a constant goal in satellite payload design to reduce or maintain power requirements. In the present invention, satellite performance will be improved because antenna gain is constant, regardless of the switching conditions. Therefore, no additional power is required to compensate for the activation of the redundant amplifier. Therefore, another advantage of the present invention is that it reduces power requirements for signals traveling therethrough.

Additional advantages and features of the present invention will become apparent from the description that follows, and may be realized by means of the instrumentalities and combinations particularly pointed out in the appended claims, taken in conjunction with the accompanying drawings.

BRIEF DESCRIPTION OF DRAWINGS

In order that the invention may be well understood, there will now be described some embodiments thereof, given by way of example, reference being made to the accompanying drawings, in which.

DETAILED DESCRIPTION

The present invention is illustrated with respect to a gain and phase balanced amplifier redundancy system, particularly suited to the satellite communications field. The present invention is, however, applicable to various other uses that may require amplifier redundancy systems, as will be understood by one skilled in the art.

Figure 1:
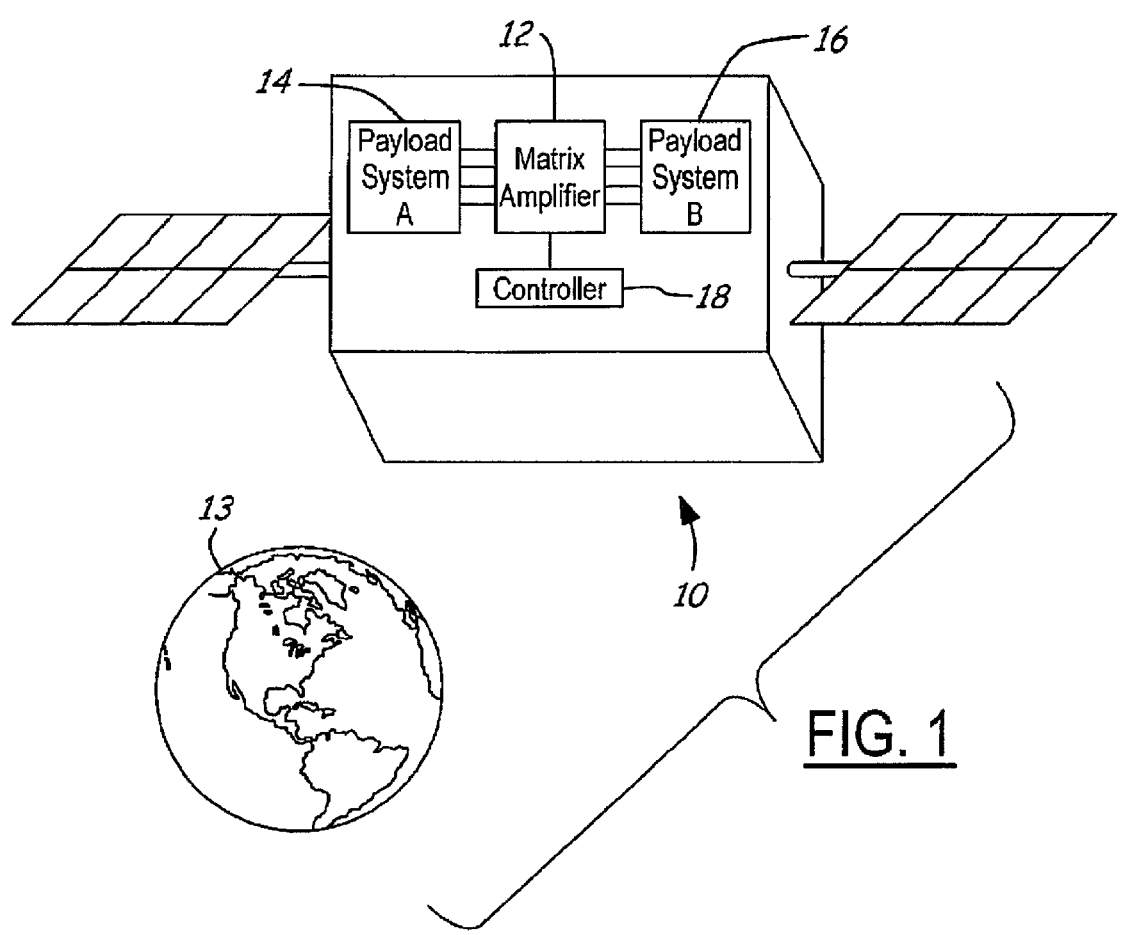
FIG. 1 illustrates a satellite system including an amplifier redundancy system in accordance with one embodiment of the present invention.
Figure 2:
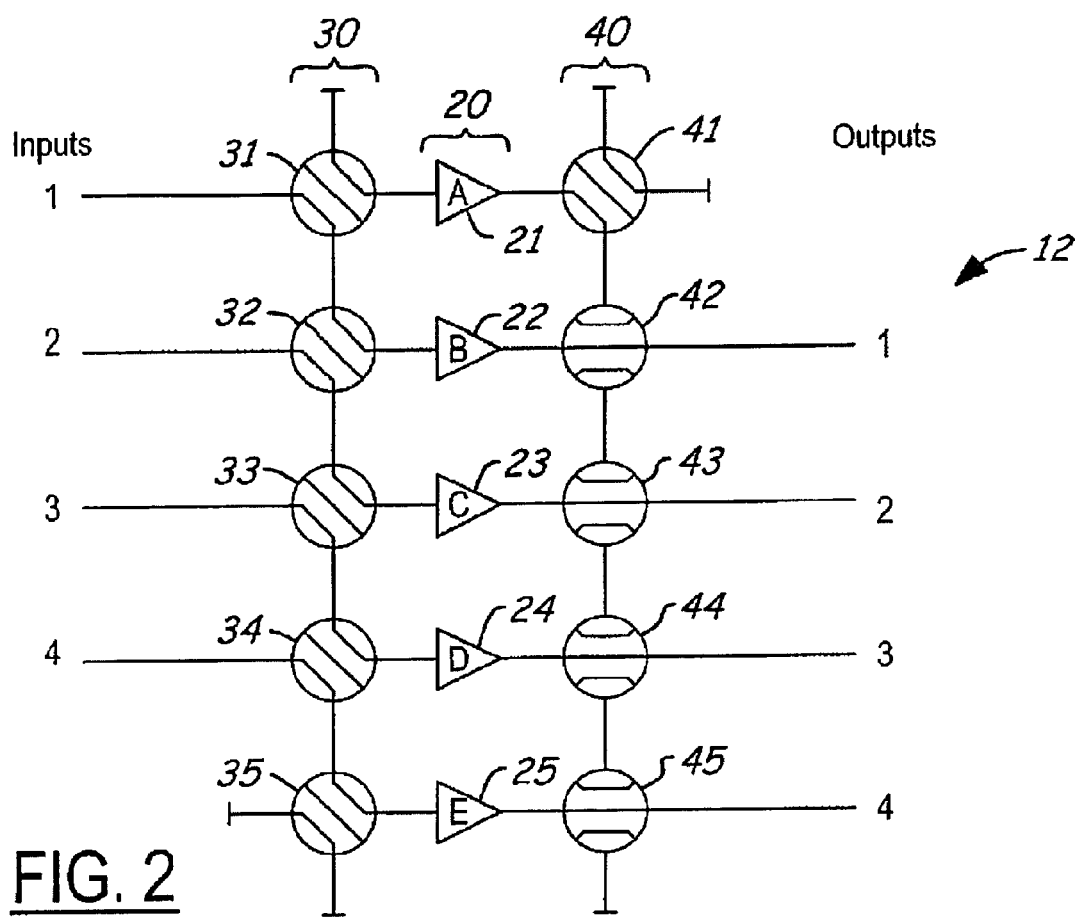
FIG. 2 illustrates an amplifier redundancy system in accordance with FIG. 1.

Referring to FIGS. 1 and 2, the communications system 10, including an amplifier redundancy system 12 is illustrated. The aerospace system 10 is merely an illustrative example of a satellite payload orbiting the earth 13 wherein the amplifier redundancy system 12 would be beneficial and is not meant to be limiting, as will be understood by one skilled in the art.

The amplifier redundancy system 12 will typically receive inputs from a payload system 14, such as a set of upconverters or switches, amplify the signals, and then generate outputs which will typically be received by an additional payload system 16, such as an antenna, as will be understood by one skilled in the art. The amplifier redundancy system 12 includes a plurality of amplifiers 20 associated with a plurality of switches including a plurality of input switches 30 and a plurality of output switches 40. The system 12 may be controlled by, for example, a controller 18. Important to note is that the aerospace system 10 may include a transmitting or receiving satellite, and the amplifiers 20 may amplify transmitted or received signals.

FIG. 2 illustrates a redundancy system having no amplifier failures. Illustrated are five amplifiers: A, B, C, D, and E (21, 22, 23, 24, and 25 respectively). A plurality of input switches 30 transmit input signals through the amplifiers 20 and to a plurality of output switches 40, which transmit output signals to the various payload systems. The inputs and outputs are offset such that the input switches 30 are configured in the "side port" position while the output switches 40 are in the "through port" position. Each path from input to output passes through two switches in the side port position and one switch in the through port position when there are no amplifier failures.

To clarify, a first switch 31 in the side port position receives an input signal, which is then received in a second input switch 32 also in the side port position. The second amplifier, amplifier 22 amplifies the input signal, and an output switch 42 in the through port position transfers the signal to an output. Likewise, a second input is received in input switch 32, and transferred to switch 33 and then amplified in the third amplifier 23. The signal is then output through output switch 43 also in the through port position. Alternate embodiments include, for example, amplifier 23 functioning as a second redundant amplifier for the first redundant amplifier 21 or for another amplifier in the plurality of amplifiers 20.

Furthermore, a third input is received in switch 33, transferred to switch 34, amplified in the third amplifier 24, and output through switch 44 also in the through port position. A fourth signal is received in switch 34, transferred to switch 35, amplified in the fifth amplifier 25, and output through switch 45, also in the through port position.

Important to note is that when the system has no failures, the first amplifier 21 is not receiving an input signal nor generating an amplified output signal, however amplifier 21 is adapted to receive an input signal through switch 31 and transfer it through output switch 41.

Switching operations either activate automatically in response to amplifier failures or are activated by a controller, such as controller 18, as a function of amplifier checking logic.

Figure 3:
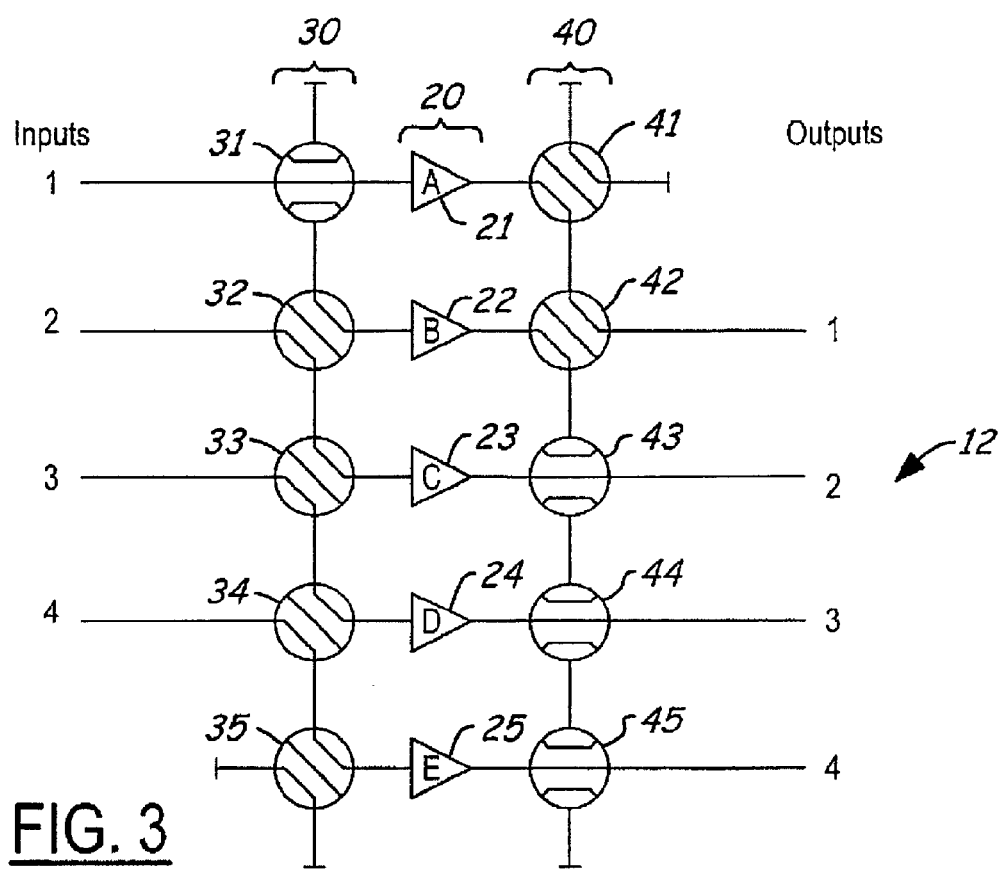
FIG. 3 illustrates the amplifier redundancy system of FIG. 2 having a failed amplifier.

Referring to FIG. 3, an amplifier redundancy system including a failed amplifier 22 is illustrated. Important to note is that each path from the input signal to the output signal still passes through two switches in the side port position and one switch in the through port position, maintaining the same phase length as for the no failure case. Resultantly, no degradation of payload performance is suffered because of differences in phase for different paths.

In other words, switch 31 is switched from the side port position to the through port position, thereby allowing the first input signal to travel directly through the switch 31 for amplification in redundant amplifier 21, wherein the amplified signal is received in output switch 41 in the side port position and then received in output switch 42 also in the side port position, the signal is then output from the amplifier redundancy system 12. Meanwhile, no signal transfers through the failed amplifier 22.

Although the output side includes two switches for some paths, and one switch for some paths, the output power levels of the amplifiers are maintained because the output loss increase is offset by the input loss decrease. In other words, the gain of the path is held constant. There may be a small degradation in noise power ratio (NPR) performance since the amplifier may be slightly overdriven. If this is not negligible, it can be compensated for by slightly adjusting the amplifier drain voltage, using controller 18 from FIG. 1.

Important to note further is that input and output switches can be ganged in pairs. For example, input switch 31 and output switch 42 could be ganged, input switch 32 and output switch 43 could be ganged, etc. Switches 35 and 41 are generally not thrown and are included to make the input to output paths identical.

Figure 4:
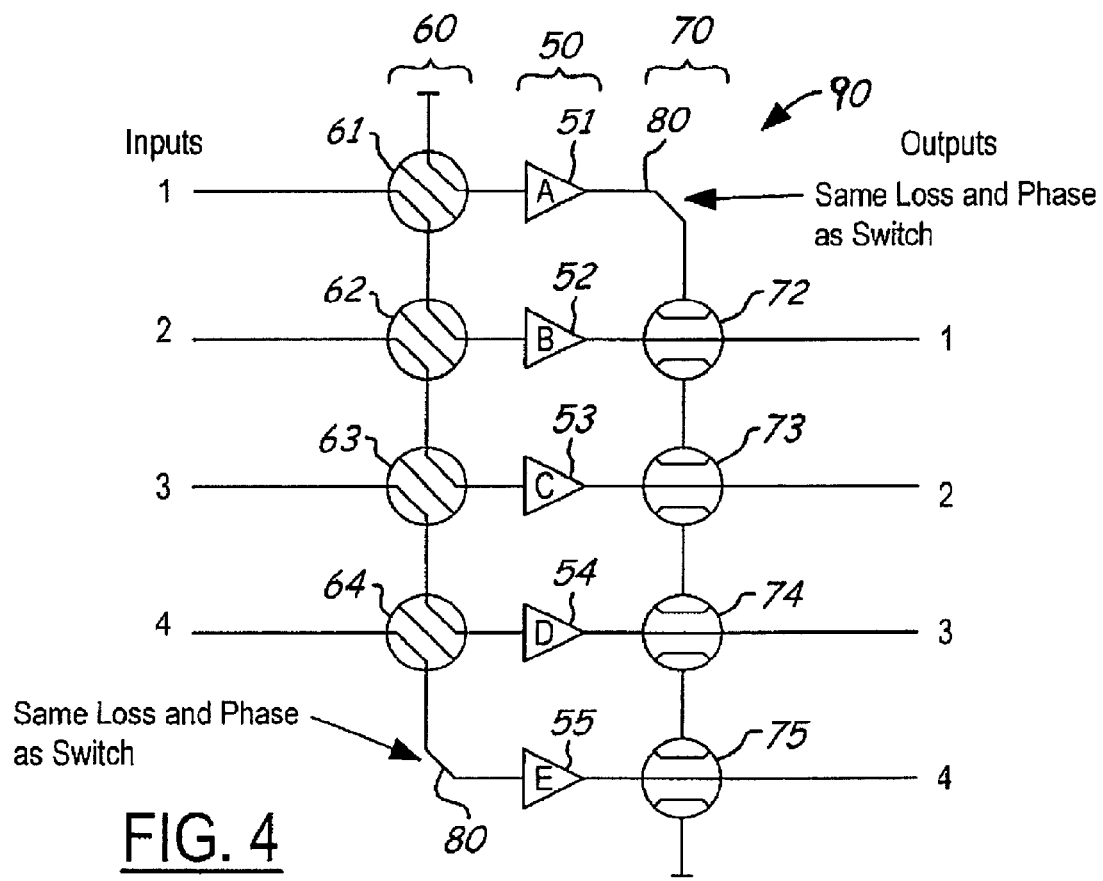
FIG. 4 illustrates an alternate amplifier redundancy system in accordance with another embodiment of the present invention.

Referring to FIG. 4, an alternate redundancy system 90 having fewer switches than the redundancy system 12 of FIGS. 2 and 3 is illustrated. The alternate system removes switches 35 and 41 of FIGS. 2 and 3, replacing them with transmission lines 80 of equivalent length. If the line 80 is designed to have the same phase and amplitude performance over the operating frequency range as the switch it is replacing, the switch may be removed, to save cost and decrease mass. Otherwise, the system 90 includes a similar first input switch 61, second input switch 62, amplifier 52, redundant amplifier 51, and output switch 72 configuration as FIGS. 2 and 3. The system further includes similarly arranged third, forth, and fifth amplifiers (53, 54, 55 respectively), and input switches 63, 64, and output switches 73, 74, and 75.

Figure 5:
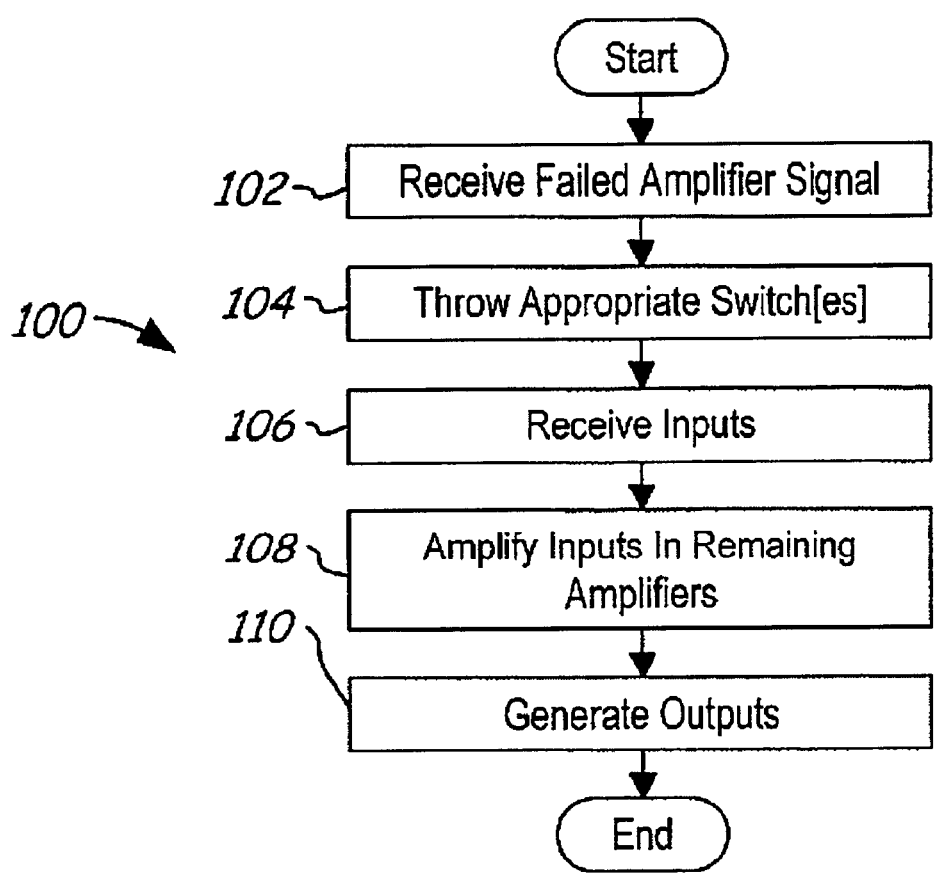
FIG. 5 illustrates a logic flow diagram of a method for operating an amplifier redundancy system in accordance with another embodiment of the present invention.

Referring to FIG. 5, a logic flow diagram illustrating the operations of a gain and phase balanced amplifier redundancy system is illustrated. Logic starts in operation block 102 wherein failed amplifier signal data is detected by for example, the controller 18. Alternate embodiments include automatic switching of the switches in response to failure of an amplifier. In operation block 104, the appropriate switch or switches are thrown to redirect signals around the failed amplifier. In operation block 106, the inputs are received through the switches, and in operation block 108 amplified in the remaining amplifiers. In operation block 110, amplified outputs are received in payload systems, such as the payload system 18, through the output switches.

In operation, a method for operating an amplifier redundancy system includes determining a failure in at least one of a plurality of amplifiers; redirecting input from the at least one of the plurality of amplifiers to at least one redundant amplifier through switching one of a plurality of input switches from a side port position to a through port position; and receiving input from the at least one redundant amplifier through at least one of a plurality of output switches through switching the at least one of the plurality of output switches from a through port position to a side port position.

Amplifier drain voltage is also adjusted in response to a degradation in noise power ratio as a function of operation of the at least one redundant amplifier. Also, a second redundant amplifier may be activated in response to a failure in the at least one redundant amplifier.

From the foregoing, it can be seen that there has been brought to the art a new and improved amplifier redundancy system 12. It is to be understood that the preceding description is merely illustrative of some of the many specific embodiments that represent applications of the principals of the present invention. For example, a vehicle, such as an airplane, spacecraft, or automobile could include the present invention as a redundancy amplifier system to minimize signal line travel, thereby reducing energy requirements and signal degradation. Numerous and other arrangements would be evident to those skilled in the art without departing from the scope of the invention as defined by the following claims.

What is claimed is:

1. A satellite system including an antenna comprising:
    a payload system generating a plurality of input signals;
    an amplifier redundancy system comprising a first amplifier receiving at least one of said plurality of input signals from a first input switch when said first input switch is in a through port position,
    a first output switch in a side port position, wherein said first output switch receives signals from said first amplifier,
    a second amplifier receiving said at least one of said plurality of input signals from said first input switch through a second input switch and generating amplified signals therefrom,
    said first input switch in a side port position, wherein said first input switch switches to said through port position in response to a failure in said second amplifier,
    a second output switch in a through port position, wherein said second output switch switches to a side port position and receives signals through said first output switch in response to said failure in said second amplifier,
    wherein said second input switch receives said at least one of said plurality of input signals from said first input switch when said first input switch is in said side port position; and
    a controller controlling switching operations of said amplifier redundancy system in response to a determined failure in said second amplifier, said controller receiving signals from said second output switch and operating satellite systems in response thereto.

2. The system according to claim 7 further comprising:
    a third amplifier receiving signals from a third input switch in a side port position through said second input switch in said side port position; and
    a third output switch receiving signals from said third amplifier when said third output switch is in a through port position.

3. The system according to claim 2 further comprising a fourth amplifier activated in response to failure of said third amplifier.

4. The system according to claim 1, wherein said payload system comprises a sensor, a controller, a set of upconverters, switches, or a signal generator.

5. The system according to claim 1 further comprising a controller adjusting amplifier drain voltage in response to a degradation in noise power ratio as a function of operation of said first amplifier.

6. The system according to claim 1, wherein said first input switch and said second output switch are ganged.

7. An amplifier redundancy system comprising:
    a first amplifier receiving signals from a first input switch when said first input switch is in a through port position;
    a second amplifier receiving signals from said first input switch through a second input switch and generating amplified signals therefrom,
    said first input switch in a side port position, wherein said first input switch switches to said through port position in response to a failure in said second amplifier, said second input switch receiving signals from said first input switch when said first input switch is in said side port position and said second input switch is in said side port position; and
    an output switch in a through port position, wherein said output switch switches to a side port position and receives signals from said first amplifier in response to said failure in said second amplifier.

8. The system according to claim 7 further comprising a controller adjusting amplifier drain voltage in response to a degradation in noise power ratio as a function of operation of said first amplifier.

9. The system according to claim 7, wherein said first input switch and said second output switch are ganged.

10. The system according to claim 7 further comprising a controller adjusting amplifier drain voltage in response to a degradation in noise power ratio as a function of operation of said redundant amplifier.

11. The system according to claim 7, wherein members of said plurality of input switches are ganged with members of said plurality of output switches.

* * * * *